United States Patent
Towler et al.

(10) Patent No.: US 6,834,003 B2
(45) Date of Patent: Dec. 21, 2004

(54) CONTENT ADDRESSABLE MEMORY WITH PFET PASSGATE SRAM CELLS

(75) Inventors: Fred John Towler, Essex Junction, VT (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 10/065,842

(22) Filed: Nov. 25, 2002

(65) Prior Publication Data

US 2004/0100810 A1 May 27, 2004

(51) Int. Cl.[7] .......................... G11C 15/00; G11C 7/00
(52) U.S. Cl. .................................... 365/49; 365/189.04
(58) Field of Search ..................... 365/49, 154, 189.07, 365/189.08, 189.04

(56) References Cited

U.S. PATENT DOCUMENTS

| | | | |
|---|---|---|---|
| 5,339,076 A | 8/1994 | Jiang ............................ 341/51 |
| 5,471,605 A | 11/1995 | Ruby ........................... 395/445 |
| 5,646,878 A | 7/1997 | Samra ........................... 365/49 |
| 5,703,803 A | 12/1997 | Shadan et al. ................. 365/49 |
| 6,012,133 A | 1/2000 | Shadan et al. ............... 711/207 |
| 6,026,012 A | 2/2000 | Hsue ........................... 365/154 |
| 6,078,987 A | 6/2000 | Kongetira .................... 711/108 |
| 6,111,780 A | 8/2000 | Bertin ......................... 365/154 |
| 6,157,558 A | 12/2000 | Wong ........................... 365/49 |
| 6,172,894 B1 | 1/2001 | Hannum ....................... 365/49 |
| 6,175,514 B1 | 1/2001 | Henderson et al. ........... 365/49 |
| 6,188,594 B1 | 2/2001 | Ong ............................. 365/49 |
| 6,191,970 B1 | 2/2001 | Pereira ........................ 365/49 |
| 6,341,083 B1 | 1/2002 | Wong .......................... 365/154 |
| 6,480,406 B1 * | 11/2002 | Jin et al. ....................... 365/49 |
| 6,522,562 B2 * | 2/2003 | Foss ............................. 365/49 |

OTHER PUBLICATIONS

IBM Technical Disclosure Bulletin, Bertin et al., "Stacked Dense CMOS RAM Using Silicon on Insulator Technology", vol. 27, No. 6, Nov. 1984, pp. 3492–3493.

* cited by examiner

*Primary Examiner*—Thong Q. Le
(74) *Attorney, Agent, or Firm*—Scully, Scott, Murphy & Presser; Robert A. Walsh, Esq.

(57) ABSTRACT

A Content Addressable Memory (CAM) cell with PFET passgate SRAM cells which results in a smaller cell size because of the more balanced number of 8 PFET devices and 8 NFET devices. The PFET passgates allow the size of the SRAM cell pulldown devices to be reduced, and lower the power dissipation in the SRAM during standby or during read/write.

10 Claims, 6 Drawing Sheets

CAM Cell with NFET Passgates
3.1x3.1=9.61  0.13um Node

P-passgate CAM 2.0x3.9 = 7.80
N-Passgate CAM 3.1x3.1 = 9.61

CAM cell with PFET Passgates
2.0x3.9=7.8

CAM Cell with PFET Passgates    FIG. 2C
Wiring : CA-M1-V1-M2-V2-M3
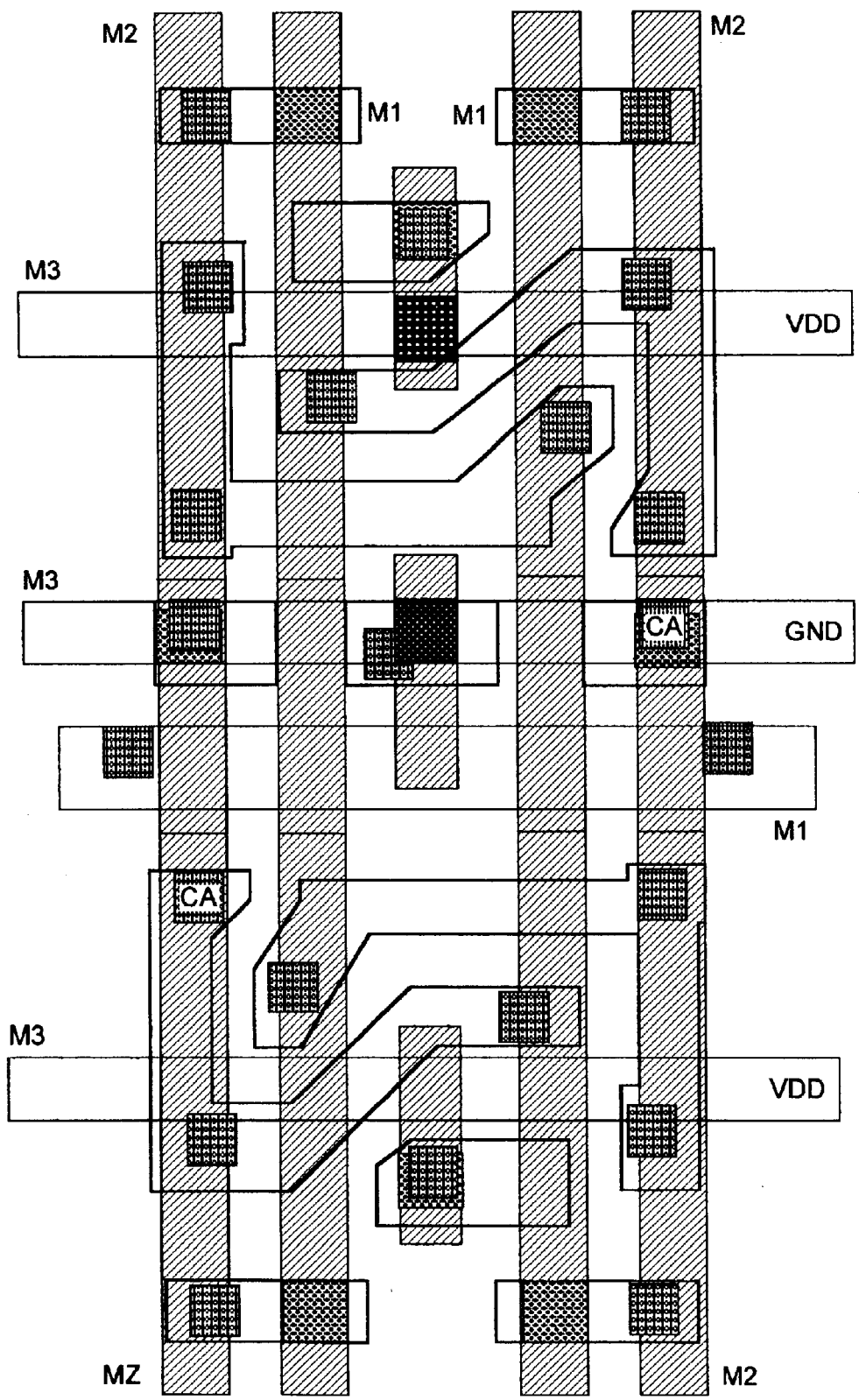

CAM Cell with PFET Passgates
Dimensions @ 0.13 um node

CONTENT ADDRESSABLE MEMORY WITH PFET PASSGATE SRAM CELLS

BACKGROUND OF THE INVENTION

1. Field of the Invention

The present invention relates generally to An SRAM based CAM (Content Addressable Memory) cell with PFET passgate SRAM cells which results in a smaller cell size because of a more balanced number of PFET devices and NFET devices.

2. Discussion of the Prior Art

CAM (Content Addressable Memory) is the main component of internet routers and switches. CAM can also be used in many other applications such as pattern recognition and cryptography. A full ternary CAM cell in general consists of two memory bits and the compare logic. The full ternary CAM cell allows full array search with per bit masking. The memory bits may be provided by DRAM cells or SRAM cells. DRAM based CAM is smaller, but requires the more complex DRAM process and the refresh operation to maintain the data. SRAM based CAM is larger, but the fabrication process is cheaper and the design is simpler. A typical SRAM based CAM cell consists of 16 devices, with 4 PFETs providing the SRAM cell pull ups, and with 12 NFETs for the SRAM cells and for the compare logic. The size is very large, about 4–5 times the size of a typical 6T SRAM cell. A typical 6T SRAM cell consists of 2 pull up PFETs, 2 pull down NFETs and 2 passgate NFETs.

FIG. 1A is a circuit schematic, with a truth table of operation, of a prior art full ternary CAM cell with NFET passgates which comprises 16 transistors, 4 PFETs and 12 NFETS.

FIG. 1B is a circuit layout of the prior art full ternary CAM cell of FIG. 1A and illustrates further details of the prior art design at the 0.13 um node of CMOS technology, which is shown for circuit area comparison purposes with the full ternary CAM cell with PFET passgates of the present invention.

BRIEF SUMMARY OF THE INVENTION

The present invention provides a Content Addressable Memory (CAM) with PFET passgate SRAM cells which results in a smaller cell size because of a more balanced number of 8 PFET devices and 8 NFET devices. Moreover, the use of PFET passgates allows the size of the SRAM cell pulldown devices to be reduced to a minimum size. The PFET passgates also consume less power as PFET off currents are generally much smaller than NFET off currents. The ratio is about 1 to 20. The standby power is further reduced because the SRAM pull down NFETs are smaller with the PFET passgates. With PFET passgates, the SRAM read/write bit lines can also be biased to some voltage level between GND and VDD, instead of to VDD as in the prior art. For example, if the read/write bit lines are biased at one half VDD, the SRAM read/write power can be lowered by 3/4. Thus the standby power dissipation and the read/write power are both reduced.

BRIEF DESCRIPTION OF THE SEVERAL VIEWS OF THE DRAWINGS

The foregoing objects and advantages of the present invention for a content addressable memory (CAM) with PFET passgate SRAM cells may be more readily understood by one skilled in the art with reference being had to the following detailed description of a preferred embodiment thereof, taken in conjunction with the accompanying drawings wherein like elements are designated by identical reference characters throughout the several views, and in which:

FIG. 2C shows the metal wiring of the design of FIG. 2B.

DETAILED DESCRIPTION OF THE INVENTION

The present invention provides a CAM cell layout with PFET passgate SRAM cells which allows the CAM cell area to be reduced to about 20% the size of a typical prior art SRAM cell with NFET passgates. The more optimized CAM cell layout is a result of a more balanced design of 8 PFETs and 8 NFETs in the overall circuit.

The layout layers and other references in the Figures are shown as:

RX: active silicon
PC: Polysilicon conductor
NW: N-type well for the PFET
CA: Contacts, between PC or RX and M1
M1: 1st layer of metal
V1: Via connection between M1 and M2
M2: 2nd layer of metal
V2: Via connection between M2 and M3
M3: 3rd layer of metal
VDD: power supply
GND: ground
EC: electrical connector by M1
WL: wordline
ML: matchline FIGS. 2A and 2B are respectively a circuit schematic, with a truth table of operation, and a circuit layout of a preferred embodiment of a full ternary CAM cell with PFET passgates pursuant to the present invention.

Figure 2A:
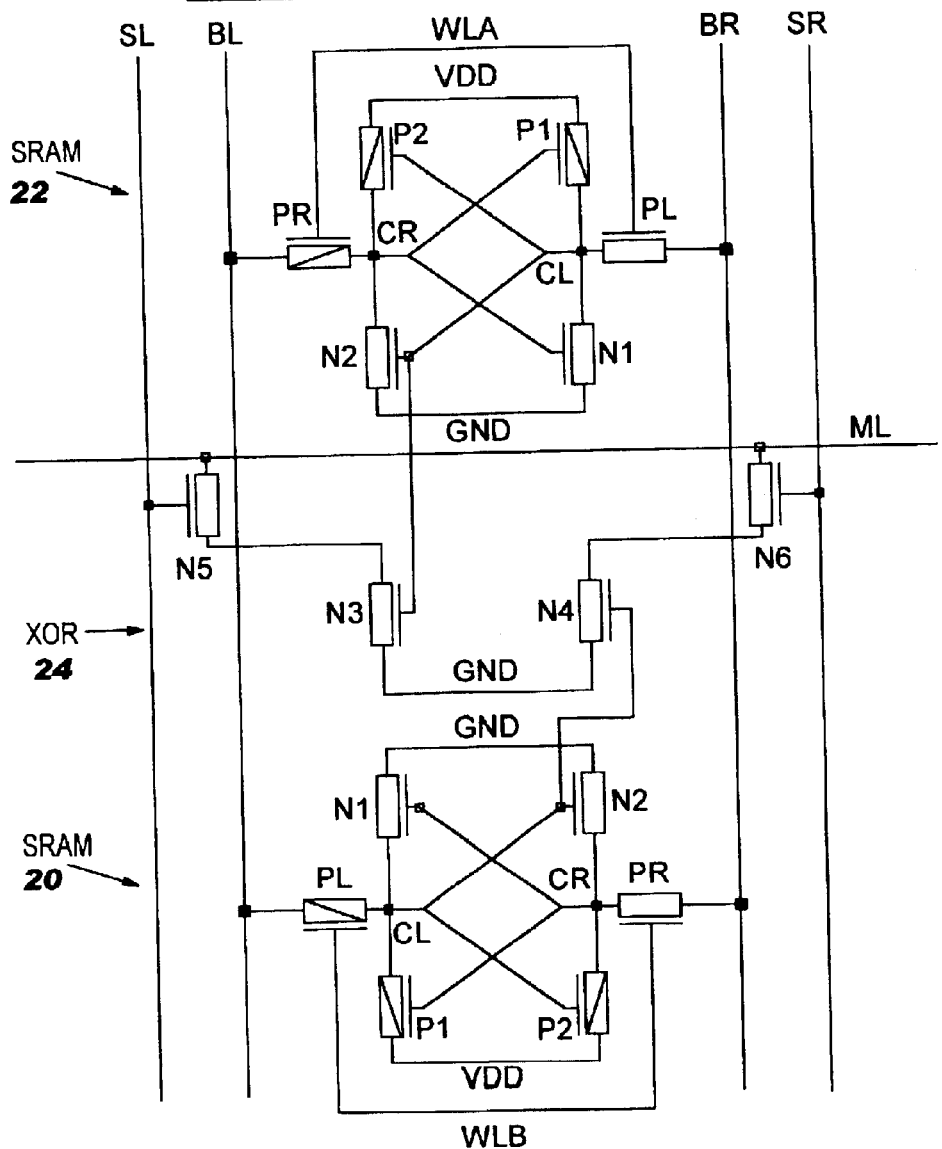
FIGS. 2A and 2B are respectively a circuit schematic, with a truth table of operation, and a circuit layout of a preferred embodiment of a full ternary CAM cell with PFET passgates pursuant to the present invention.
Figure 2B:
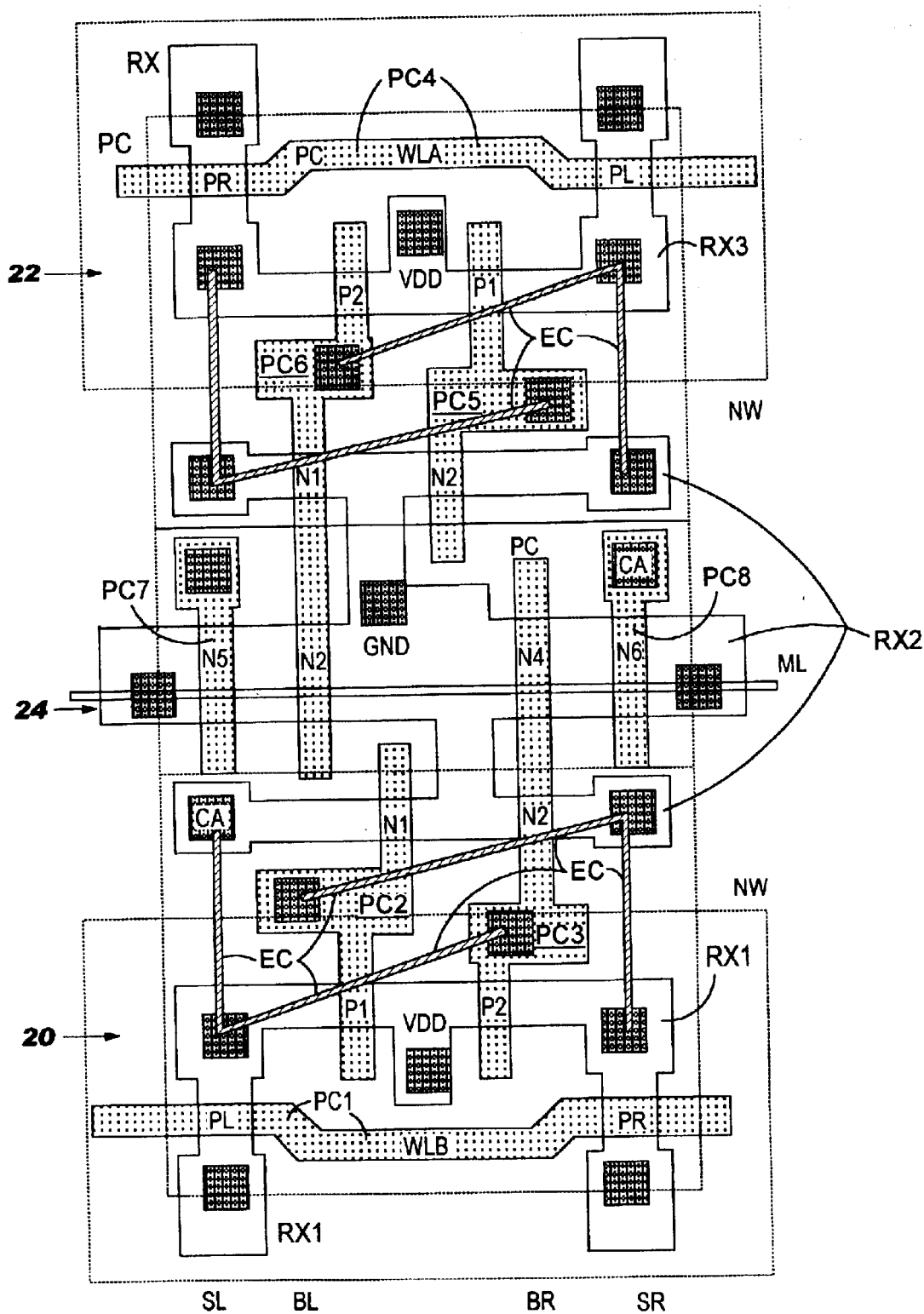

Referring to FIG. 2A, the full ternary CAM cell with PFET passgates includes a bottom SRAM 20 consisting of 6 devices, 2 NFET pull down devices N1, N2, 2 PFET pull up (to VDD) devices P1, P2, and 2 PFET passgate devices, a passgate left device PL and a passgate right device PR.

The full ternary CAM cell further includes a top SRAM 22 consisting of 6 devices which form a duplicate of the bottom SRAM circuit, with the 6 devices being reversed from left to right with respect to the bottom SRAM circuit. Thus, the top SRAM includes 2 NFET pull down devices N1, N2 reversed left to right, 2 PFET pull up (to VDD) devices P1, P2 reversed left to right, and 2 PFET passgate devices reversed left to right, a passgate left device PL (which is actually on the right side) and a passgate right device PR (which is actually on the left side).

The full ternary CAM cell further includes a middle exclusive OR (XOR) gate 24 consisting of 4 NFET devices N3, N4, N5, N6.

The full ternary CAM cell includes 2 wordlines, WLA for the top SRAM 22 and WLB for the bottom SRAM 20, 2 bitlines, bitline left BL and bitline right BR, 2 searchlines, searchline left SL and searchline right SR, and a master data line ML.

Figure 1A:
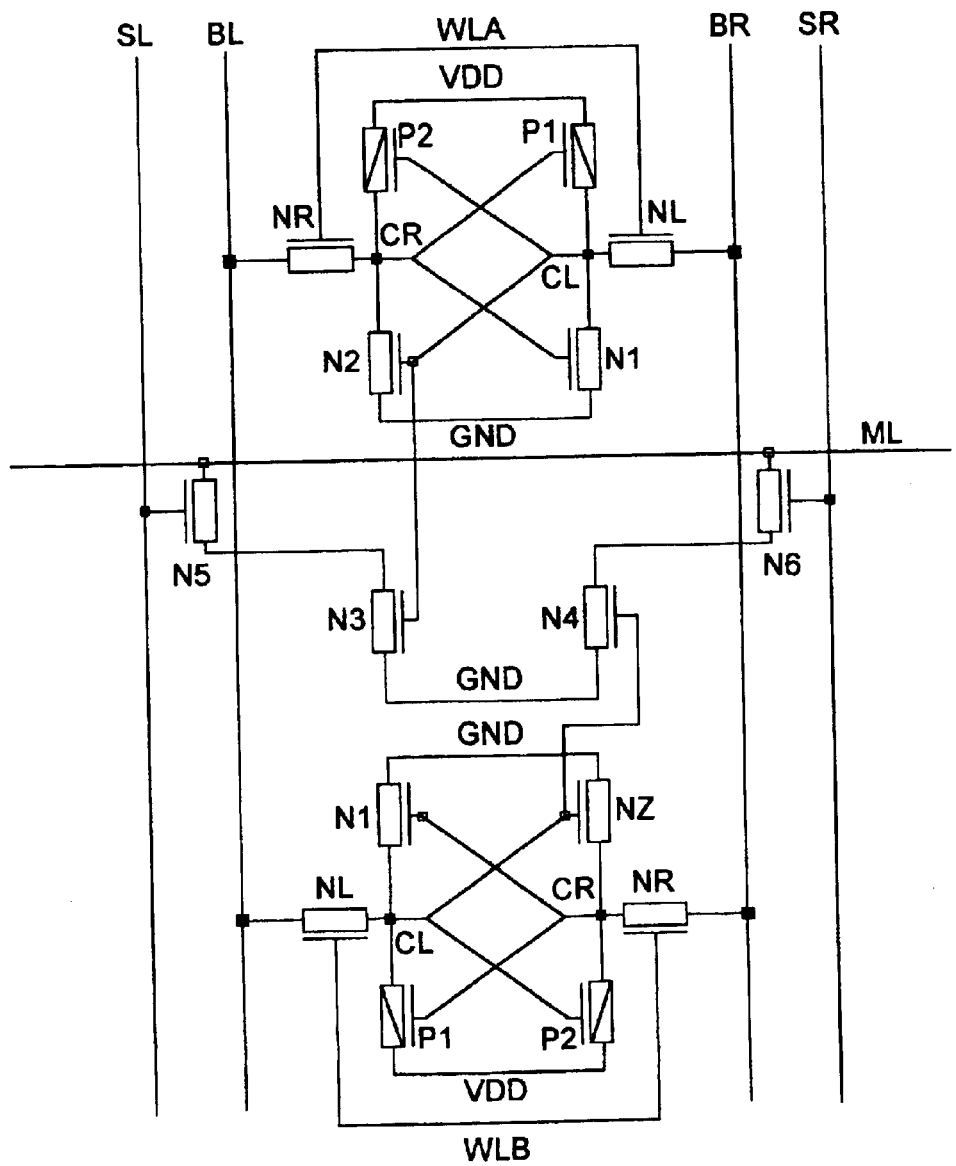
FIG. 1A is a circuit schematic, with a truth table of operation, of a prior art full ternary CAM cell with NFET passgates.
Figure 1B:
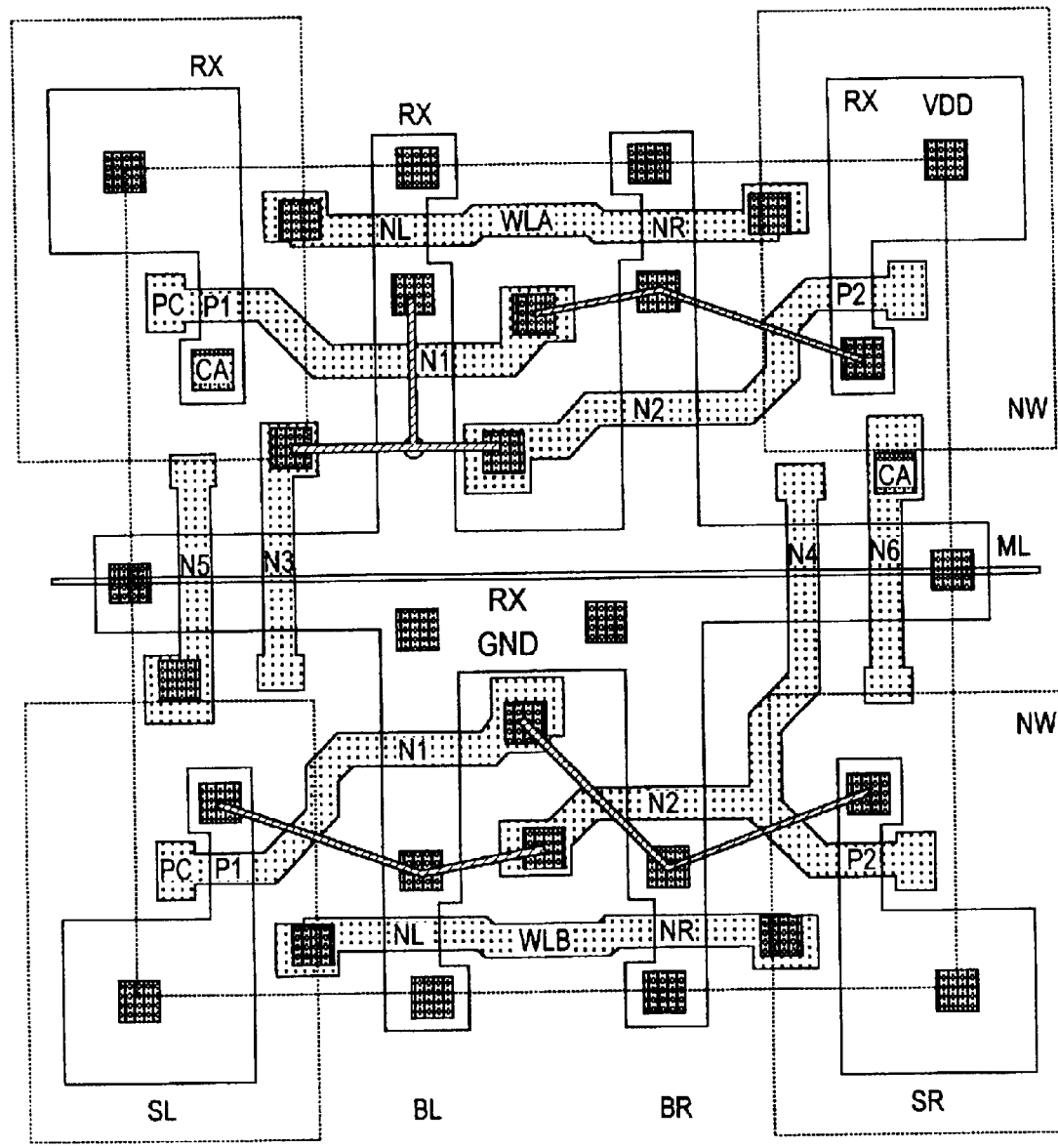
FIG. 1B is a circuit layout of the prior art full ternary CAM cell of FIG. 1A.

The full ternary CAM cell operates in accordance with the truth table shown in FIG. 1 wherein the 4 possible states are shown, in lines 1–4, of CELLA, the top SRAM connected to WLA, and CELLB, the bottom SRAM connected to WLB. The 4 states correspond respectively to the states 00 (DON'T CARE), 01 (ZERO), 10 (ONE), 11 (MISMATCH ALWAYS). It is noted that the truth table of FIG. 2A is the same truth table of operation as the prior art CAM cell with NFET passgates as shown in FIG. 1A.

Taking line 2 of the truth table as an example, wherein CELLA is 0 and CELLB is 1, this corresponds to device N3 being OFF and device N4 being ON. If SL is 0, and SR is 1, the search operation will result in a "MISS" condition or "MISMATCH" condition with the ML being pulled down. This means that the CAM cell data is 0 while the search is for 1, and so the search is unsuccessful. On the other hand, if CELLA is 1 and CELLB is 0 as shown in line 3 of the truth table, the match line ML will not be pulled down when the same search bit is presented, with SL at 0 and SR at 1.

Assume phone numbers are listed under customer names, and the customer names are encoded into 100 bits. When these 100 bits of a customer name are presented to the CAM, and if all 100 bits are matched with the stored data, the ML will not be pulled down and the match signal staying high will access the corresponding entry of phone number.

If CELLA is 0 and CELLB is 0 as shown in line 1 of the truth table, then the CAM cell will not pull the ML down. The CAM data is thus "masked off" from the search operations.

Lines 1, 2, 3 of the truth table form the "ternary" states of the CAM cell. The fourth state with CELLA at 1 and cellB at 1 is not used in the search operations. When each bit can be independently "masked off", the CAM cell is referred to as a full ternary CAM cell. If the "masking" can be applied only to a group of more than 1 bit, the CAM cell is then not a "full ternary" CAM cell.

FIG. 2B is a circuit layout of a preferred embodiment of a CAM cell with PFET passgates pursuant to the present invention. The bottom of FIG. 2B shows the layout of the bottom SRAM 20 six devices N1, N2, P1, P2, PL, PR, which are shown as being formed at the intersections of first and second different active silicon regions RX1, RX2 with first, second and third different polysilicon conductors PC1, PC2, PC3 of the cell. The top of FIG. 2B shows the layout of the top SRAM 22 six devices N1, N2, P1, P2, PL, PR which are also formed at intersections of second and third different active silicon regions RX2, RX3 with fourth, fifth and sixth different polysilicon conductors PC4, PC5, PC6. The middle of FIG. 2B shows the layout of the exclusive OR gate 24 four devices N3, N4, N5, N6 which are also formed at intersections of the second active silicon region RX2 with third. sixth, seventh and eighth different polysilicon conductors PC3, PC6, PC7, PC8

The bottom of FIG. 2B shows the layout of the bottom SRAM 20 and shows a generally M shaped first active silicon region labeled RX1. A generally shallow U shaped first polysilicon conductor labeled PC1 crosses the M shaped active silicon region RX1 twice at the two end legs thereof to form the gates of the devices PL, PR, wherein the top of the RX1 active silicon region forms the source of each of the devices PL, PR, and the bottom of the RX1 region forms the drain of each of the devices PL, PR.

Referring to the middle of FIG. 2B, a second active silicon region labeled RX2 includes a wide width, horizontally extending portion, and narrower width, horizontally extending top and bottom portions, with the wide central portion connecting to the narrower top portion by a vertically extending, left of center portion, and connecting to the narrower bottom portion by a vertically extending, right of center portion.

Referring to the middle left bottom of FIG. 2B, a second polysilicon conductor PC2 extends vertically downwardly to cross the M shaped region RX1 to form the gate of device P1, with the drain of P1 being formed in the M shaped active silicon region to the left of the gate, and the source of P1 being formed in the M shaped region to the right of the gate. The second polysilicon conductor PC2 also extends vertically upwardly to cross the bottom horizontally extending portion of the second region RX2 to form the gate of device N1, with the drain of N1 being formed in the bottom horizontally extending active silicon portion to the left of the gate, and the source of N1 being formed in the bottom horizontally extending portion to the right of the gate.

Referring to the middle right bottom of FIG. 2B, a third polysilicon conductor PC3 extends vertically downwardly to cross the M shaped region RX1 to form the gate of device P2, with the drain of P2 being formed in the M shaped active silicon region to the right of the gate, and the source of P1 being formed in the M shaped region to the right of the gate. The third polysilicon conductor PC3 also extends vertically upwardly to cross the bottom horizontally extending portion of the second region RX2 to form the gate of device N2, with the drain of N2 being formed in the bottom horizontally extending active silicon portion to the right of the gate, and the source of N2 being formed in the bottom horizontally extending portion to the left of the gate. The third polysilicon conductor PC3 also extends further vertically upwardly to cross the middle horizontally extending portion of the second region RX2 to form the gate of device N4, with the drain of N4 being formed in the middle horizontally extending active silicon portion to the right of the gate, and the source of N4 being formed in the middle horizontally extending portion to the left of the gate.

The SRAM 22 formed in the top portion of FIG. 2B is formed symmetrically opposite to the SRAM 20 formed in the bottom portion of FIG. 2B, with an inverted (relative to RX1) M shaped active silicon region RX3, and an inverted (relative to PC1) shallow U shaped fourth polysilicon conductor PC4, and inverted (relative to PC2, PC3) fifth and sixth polysilicon conductors PC5, PC6.

The XOR circuit 24 consisting of devices N3, N4, N5, N6 is formed in the central wide width, horizontally extending active silicon portion of the second region RX2. A vertically extending polysilicon conductor PC7 intersects the central horizontally extending portion to form the gate of device N5, and a vertically extending polysilicon conductor PC8 intersects the central horizontally extending portion to form the gate of device N6. The formations of the devices N3, N4 of the exclusive OR circuit 24 have already been discussed above.

The active silicon RX regions are surrounded by STI (shallow Trench Isolation), which prevents interferences of adjacent devices.

FIG. 2B also illustrates the electrical connectors EC, which connect the different CAs (contacts) with M1 (first level metal).

FIG. 2C shows the metal wiring of the design of FIG. 2B, and shows first, second and third metal layers M1, M2, M3, connections to a power supply VDD, connections to ground GND, contacts CA, and vias V1, V2.

Figure 2D:
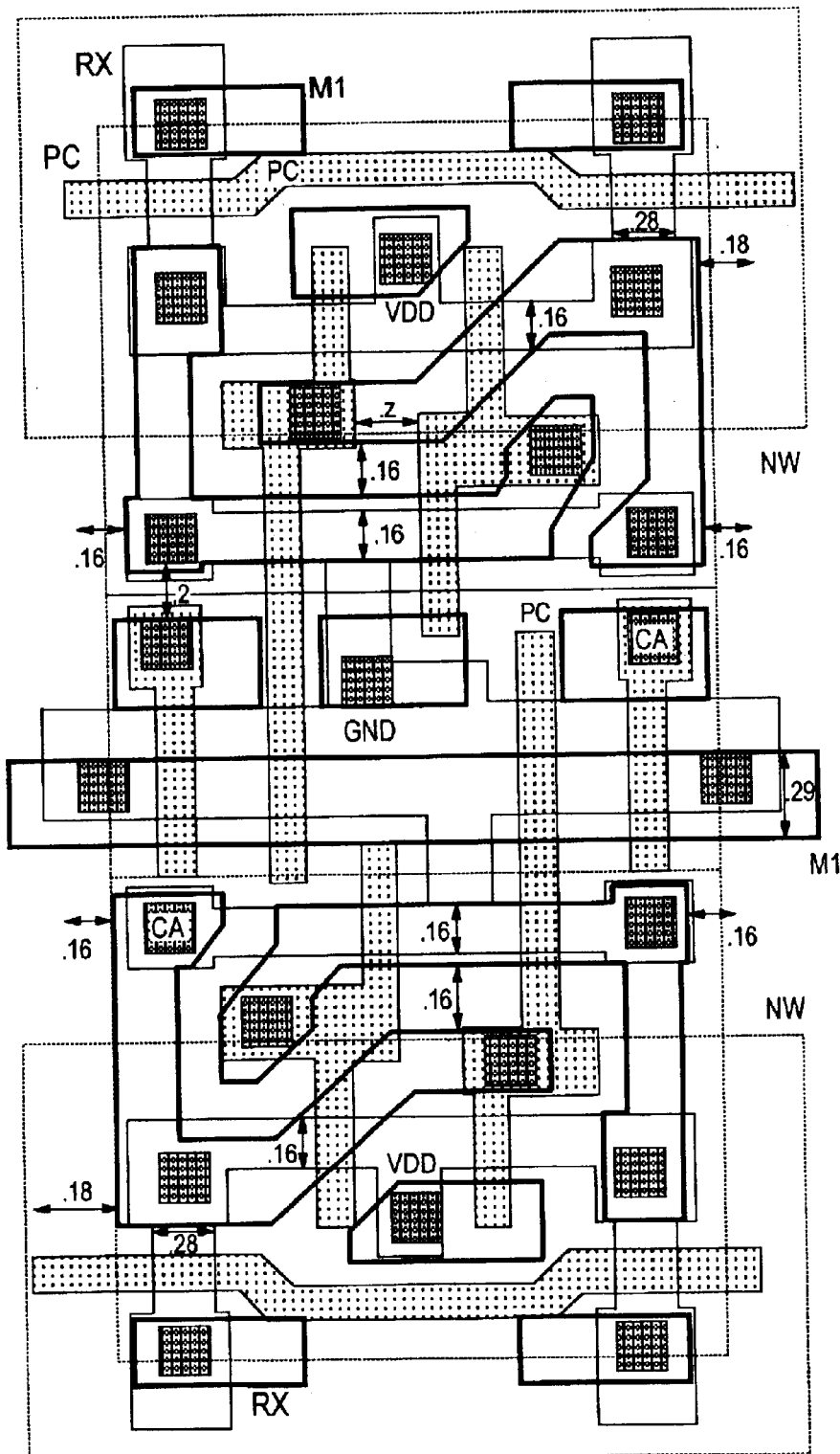
FIG. 2D corresponds generally to FIG. 2B, and illustrates further details and dimensions of the new design at the 0.13 um node of CMOS technology.

FIG. 2D corresponds generally to FIG. 2B and illustrates further details and dimensions of the new design in 0.13 um CMOS technology.

The beta ratio of a device is the ratio of the conductivity of the pull down device to the conductivity of the passgate device, and ~[m*(W/L)] of the pulldown device vs [m*(W/L)] of the passgate device, where m is the carrier mobility. For SRAM cell stability, the beta ratio is >=1.5. A higher beta ratio means better stability. If the passgate is a PFET device then the carrier mobility is half of the electron mobility of an NFET passgate. Thus for the same layout, the beta ratio would be doubled when the NFET passgate is replaced by the PFET passgate. Or the pull down NFET can be reduced by one half to maintain the same beta ratio. The reverse beta ratio is 1/(beta ratio), as a metric for the write performance of the cell, noting that it is harder to write a more stable cell. In the CAM cell of the present invention, a reverse beta ratio of about 0.6 is provided in the layout to allow read/write operations with conventional support circuitry.

The present invention replaces the NFET passgates in a CAM cell by PFET SRAM passgates, which results in a 20% improvement in density (7.80 um2 vs 9.61 um2). The additional benefits of PFET passgates are better cell stability and lower power dissipation. The simple PFET passgate layout also allows more stable and cooler operation. The present invention provides a full ternary CAM cell wherein a data bit and a mask bit are included for actual product implementation.

While several embodiments and variations of the present invention for a content addressable memory with PFET passgate SRAM cells are described in detail herein, it should be apparent that the disclosure and teachings of the present invention will suggest many alternative designs to those skilled in the art.

What is claimed is:

1. A content addressable memory (CAM) having first and second SRAMs with P-channel PFET passgates for storing first and second memory bits, and a compare logic circuit, with the CAM providing a full array search with the ability of per bit masking, the CAM cell having a reverse beta ratio of substantially 2, which is the reciprocal of the beta ratio which is the ratio of conductivity of a pull down device to the conductivity of a passgate device of a SRAM cell, allow READ and WRITE operations at first and second ports of the CAM with conventional support circuitry.

2. The CAM cell of claim 1, comprised of 8 PFET devices and 8 NFET devices.

3. The CAM cell of claim 1, wherein each of the first and second SRAMs comprises 6 devices, 2 NFET pull down devices, 2 PFET pull up devices, and 2 PFET passgate devices, a passgate left device and a passgate right device.

4. The CAM cell of claim 3, where the compare logic circuit comprises an XOR gate comprising 4 NFET devices.

5. The CAM cell of claim 3, including 2 wordlines, WLA for the first SRAM and WLB for the second SRAM, 2 bitlines, bitline left BL and bitline right BR, 2 searchlines, searchline left SL and searchline right SR, and a master data line ML.

6. The CAM cell of claim 5, wherein the CAM cell shares search bitlines and read/write bitlines, and unselected bitlines are held at ground to allow disabling of the compare logic circuit during SRAM read/write operations.

7. The CAM cell of claim 6, wherein each bitline standby bias is ½ VDD.

8. The CAM cell of claim 3, wherein the lay out of the 6 devices of the second SRAM is reversed in the circuit layout with respect to the lay out of the 6 devices of the first SRAM.

9. The CAM cell of claim 4, wherein the 6 devices of the first SRAM are formed at intersections of first and second active silicon regions with first, second and third polysilicon conductors, the 6 devices of the second SRAM are formed at intersections of second and third active silicon regions with fourth, fifth and sixth polysilicon conductors, the 4 devices of the XOR gate are formed at intersections of the second active silicon region with third, sixth, seventh and eight polysilicon conductors.

10. The CAM cell of claim 9, wherein the 6 devices of the second SRAM are laid out symmetrically opposite to the 6 devices of the first SRAM with an inverted, relative to the first active silicon region, third active silicon region, and an inverted, relative to the first polysilicon conductor, fourth polysilicon conductor, and inverted, relative to the second and third polysilicon conductors, fifth and sixth polysilicon conductors.

* * * * *